United States Patent [19]
Andris et al.

[11] Patent Number: 5,249,520
[45] Date of Patent: Oct. 5, 1993

[54] MASK SHOCK ABSORBER PAD

[75] Inventors: Gerald S. Andris, Poughkeepsie; John P. Gauci, Putnam Valley, both of N.Y.

[73] Assignee: International Business Machines Corporation, Armonk, N.Y.

[21] Appl. No.: 712,259

[22] Filed: Jun. 7, 1991

[51] Int. Cl.$^5$ .............................................. B32B 31/16
[52] U.S. Cl. ...................................... 101/126; 101/35; 101/114; 101/127.1; 156/344; 427/282
[58] Field of Search .................. 101/35, 114, 121, 126, 101/127, 127.1, 128.1, 129; 118/213; 425/113; 156/344, 358, 584, 64; 427/282; 29/829

[56] References Cited

U.S. PATENT DOCUMENTS

| | | | |
|---|---|---|---|
| 3,486,441 | 12/1969 | Hillman | 101/35 |
| 3,949,667 | 4/1976 | Zimmer | 101/119 |
| 4,902,371 | 2/1990 | Andris | 156/344 |
| 4,919,970 | 4/1990 | Hoebener | 427/96 |

FOREIGN PATENT DOCUMENTS 234877 11/1985 Japan ..................... 101/114

OTHER PUBLICATIONS

"Extrusion Printing Apparatus", vol. 6, No. 4, p. 76, Sep. 1963.

*Primary Examiner*—Edgar S. Burr
*Assistant Examiner*—Eric P. Raciti
*Attorney, Agent, or Firm*—Whitham & Marhoefer

[57] ABSTRACT

A shock absorber pad for absorbing shock caused by separation of a perforated sheet mask from a surface on which a pattern of a screened medium has been formed by forcing a viscous material through the mask which includes a plurality of protuberant features which have a separation determined in accordance with a nominal viscosity of the screened medium and a transverse feature dimension based on characteristic stand-off spacing or mask feature size increases pattern quality and extends mask life. Hollow pattern features also improve pattern quality by reducing pad contact area with the mask during separation while allowing the pad features to span mask features. Methodology of shock absorber pad design and adjustment of screened medium viscosity to pad feature spacing are included.

15 Claims, 3 Drawing Sheets

MASK SHOCK ABSORBER PAD

DESCRIPTION

Background of the Invention

1. Field of the Invention

The present invention generally relates to pattern screening processes and, more particularly, to screening processes for forming patterns on layers of multi-layer ceramic (MLC) circuit structures.

2. Description of the Prior Art

Forming patterns of a material on a surface by extruding the material through a mask, such as a perforated sheet, has been applied in many fields such as printing and engraving, graphic arts and manufacturing processes, particularly in the electronics industry. The ability to form a plurality of conductors simultaneously on a surface permits an inexpensive alternative wiring technique which also results in a compact wiring structure.

The scale of integration in integrated circuits has steadily increased over the years, resulting in integrated circuits of extreme complexity and capable of very comprehensive functions. It is often desirable in such devices to use a plurality of different integrated circuit chips within such a device to afford design flexibility, improved yield and to allow the use of different semiconductor circuit technologies within the same device. A particularly successful type of construction of such devices has been developed, which uses a plurality of layers of ceramic, glass or other insulative materials of relatively high thermal conductivity with conductors formed on the respective surfaces and in through-holes thereof. Since circuits constructed in this way are three-dimensional, a high degree of complexity is possible.

In such structures, the conductors are usually formed by a pattern of conductive paste. The conductive paste pattern is usually formed by extruding the paste, which is usually highly viscous, through a stencil or mask, such as a perforated sheet, by passing an extrusion nozzle over the mask, located on the ceramic layer or "green sheet". As shown in FIG. 2, the mask 112 will typically be formed from a perforated metal sheet having an apertured pattern. The mask structure may also have downward opening cavities supported periodically or at the periphery thereof by mask stand-offs 113 for forming large pattern areas. Such stand-offs are necessary to avoid flexing of the mask (e.g. being pushed away from the nozzle or being otherwise deformed) causing displacement of the conductive paste and shorts or voids in the conductive pattern. The term "standoffs" will be used hereinafter to refer to a mask portion at a location where paste is not to be applied and where the mask rests directly on the surface on which the pattern is to be formed. It is also common in design rules for the fabrication of such masks to specify a characteristic distance for maximum stand-off spacing, based on maximum uninterrupted feature size to be produced and the locations of stand-offs may be thought of as a regularly spaced array with the spacing corresponding to the characteristic distance.

After extrusion is complete, the mask must be separated from the green sheet without disturbing the paste pattern. Experience with manufacture of MLC devices has indicated that, at present, most defects are caused during separation of the mask from the green sheet. It should be noted that these steps are common to all screening processes for forming patterns on a surface and, while the invention will be disclosed in relation to a MLC manufacturing process in which pattern accuracy is very critical, applicability is not to be considered limited thereto.

As disclosed in U.S. Pat. No. 4,902,371, to Andris et al., assigned to the assignee of the present invention and which is fully incorporated by reference herein, most pattern defects occur near the center of the mask. Since the mask and the green sheet are both supported at their edges, as the two parts are separated, both assume a slightly bowed shape. Near the edges, the mask apertures place a shear force on the viscous paste and the mask separates cleanly. However, near the center, the mask places tension on the paste and can pull portions of paste off the green sheet under certain circumstances, causing pattern voids.

More often, as the mask separates from the green sheet with a snapping action at the center of the mask, spikes of paste are formed at the edges of the paste pattern in the central area. Since the pattern of conductive paste is often very fine, these spikes often cause shorts between conductors either by simply collapsing onto the green sheet or by having the excess paste therein spread out during further processing or when the green sheets are laminated into the final MLC device. Also, it is at this point in the screening process that greatest mechanical and acceleration forces are exerted on concentrated areas of the mask, causing deflection and distortion thereof, particularly in areas where mask features are very small. Such distortions will eventually cause metal fatigue and fracture of smaller features of the metal mask. Further, material adhering to the mask during this stage may cause defects in subsequently masked green sheets.

In an effort to reduce the spiking of the conductive paste, U. S. Pat. No. 4,902,371 proposed the provision of a shock absorbing system to minimize or limit the snapping action of the mask as the central portion of the mask was pulled free of the green sheet. In summary of that system, after extrusion of the paste through the mask, a shock absorber was lowered into place in the central area or other area of the mask which is last to pull free from the green sheet. (It should be noted that even if it is attempted to remove the mask from one end, the limitations on the flexure of the mask and the necessity that the mask not be shifted relative to the green sheet make the application of tension to the paste in some area unavoidable.) The shock absorber applies a force to the mask which is closely regulated with weights to correspond to the tensional separation force through a shock absorber pad which directly contacts the mask. Thus, as separation proceeds, rapid movement or snapping of the mask is avoided, although there may be a slight rapid movement if a corresponding snap is permitted in the green sheet, and defects are greatly reduced.

However, as experience with this system accumulated, the importance of the pad construction became evident. While it would appear intuitive that the area of the pad contacting the mask should be maximized, such an approach caused large voids in the pattern, evidently due to the causing of a partial vacuum under the pad which pulled portions of the paste pattern away from the green sheet along with the mask as separation was carried out. Therefore, it was determined that, to achieve best pattern quality the contact area between the mask and shock absorber pad should be minimized, consistent with the shock absorbing function, to avoid causing a partial vacuum during separation. To this end, a shock absorber pad having protrusions of "any geometric shape, such as, cubical, conical, semi-spherical, polyhedral, parabolic, convex, flat rectangular, pyramidical, to name a few, or any other surface shape well-known in the art" was disclosed in the patent incorporated by reference above and good results were obtained therewith. Nevertheless, further experience with such shock absorber pads has indicated that, despite substantial improvement over prior techniques and systems, a substantial number of pattern defects, including pattern voids, continue to occur and mask damage and wear remains a major factor in the expense of MLC fabrication. Further, empirical results with the pads according to the above incorporated patent indicated an irreducible minimum cost component of the process attributable to a combination of pattern defects and mask degradation.

SUMMARY OF THE INVENTION

It is therefore an object of the present invention to provide a shock absorber pad which yields a further reduction in pattern defects and reduced mask wear and damage.

It is another object of the present invention to provide a shock absorber pad which avoids pulling effects on the screened conductive paste pattern.

It is a further object of the present invention to provide a shock absorber pad which supports a wide variety of mask feature sizes to minimize mask degradation, wear and damage.

It is a yet further object of the present invention to provide a shock absorber pad which minimizes adherence of the screened medium to both the mask and the shock absorber pad.

In order to satisfy the above and other objects of the invention, an apparatus for absorbing shock caused by separation of a perforated sheet from a surface after screening a viscous material through the perforated sheet including a pad having a plurality of protuberant features thereon wherein a transverse dimension of at least one said protuberant feature is greater than a characteristic distance between mask stand-offs or a feature size of the mask and wherein a minimum separation between each of said protuberant features exceeds a distance having a predetermined relationship to a nominal viscosity of said viscous material.

According to another aspect of the invention, a shock absorbing pad is provided which includes hollow features having a concavity oriented toward the mask.

In accordance with yet another aspect of the invention, a method of designing a shock absorbing pad is provided including at least one of the steps of determining a minimum separation distance of said protuberant features based on a predetermined proportionality of said minimum separation to a nominal value of screened medium viscosity and determining a minimum transverse dimension of a protuberant feature as greater than a characteristic distance between supports for the mask.

In accordance with a further aspect of the invention, a screening method is provided including the step of adjusting viscosity of said viscous material in accordance with said predetermined spacing.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
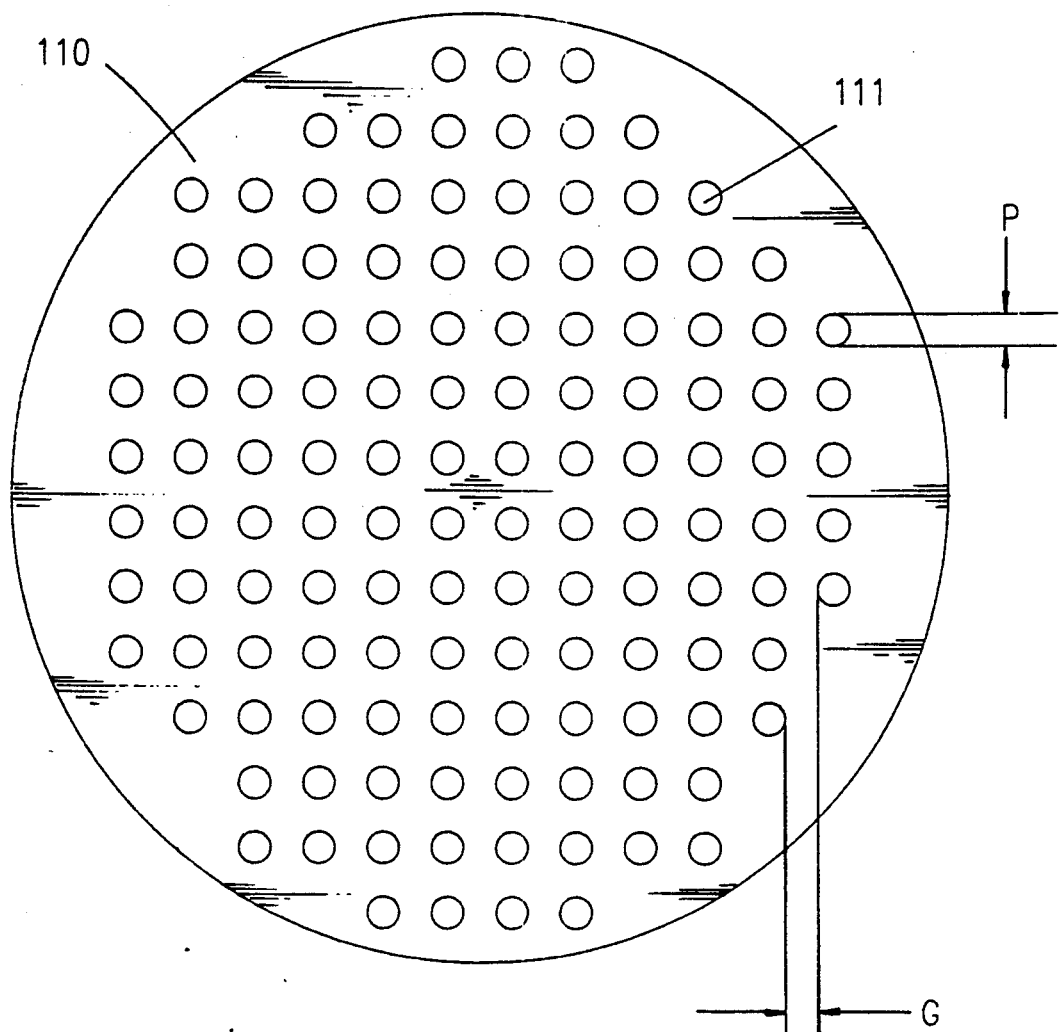
FIG. 1 is a view of the surface of one embodiment of the shock absorber pad according to the invention.
Figure 2:
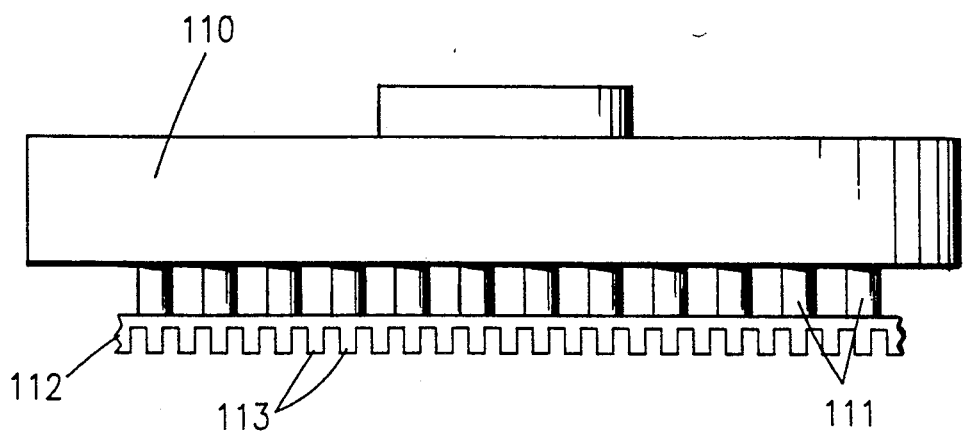
FIG. 2 is a side view of the shock absorber pad of FIG. 1, including a cross-section of the mask showing mask stand-offs.

Referring now to the drawings, and more particularly to FIGS. 1 and 2, there is shown an improved shock absorber pad 110 which achieves excellent pattern quality and ensures long mask life. In this shock absorber pad, which is superficially similar to those disclosed in U.S. Pat. No. 4,902,371, the protrusions or protuberant features 111 on the pad are formed in accordance with two particular dimensions which, as an incident of the present invention, have been found to be critical for given viscosity and adhesion properties of the screened medium (e.g. the conductive paste) and mask geometry.

Specifically, two dimensions of the pattern have been found to be critical. Dimension G must be large enough to prevent bridging of the viscous screened material between adjacent shock absorber pad features to produce acceptable results. Specifically, minimum values of G have been found to be approximately $$G = 0.00045 \, V + 0.005, \pm 10\%$$

where G is the dimension, in inches, and V is the viscosity in Pascals per second. Such acceptable values are graphically shown in FIG. 6.

Figure 6:
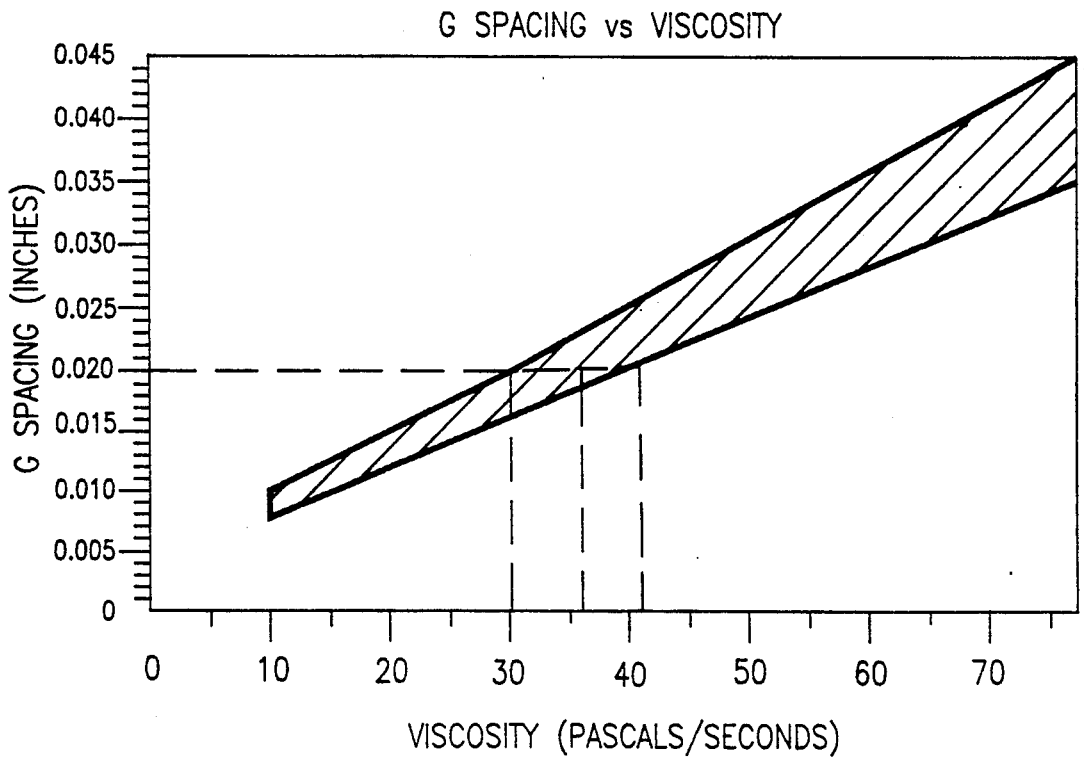
FIG. 6 is a graphical representation of values of one dimension of features of the shock absorber pad which minimize screening defects as a function of the viscosity of the screening paste.

In practice, the G dimension is minimized in accordance with the above relationship for a nominal value of the paste viscosity since the paste viscosity can be adjusted to a small degree to match the feature separation of the pad during the course of use. The relatively wide latitude of viscosities which will yield acceptable results for a given feature separation (e.g. 30–43 Pascals per second for a feature separation of 0.02 inches, as shown in FIG. 6) facilitates this procedure. In practice, a suitable viscosity for a predetermined feature separation can be approximated by solving the above equation for V or, more simply, by approximating V as 2000 times the minimum separation in inches, ±20%.

Again, it is important to an understanding of the invention to note that the G dimension is important to the screening quality since build-up of viscous paste on the shock absorber features effectively increases the area of those features, possibly causing a partial vacuum which could lift portions of the screened pattern off of the green sheet during separation or providing additional paste to the mask from which spikes or other pattern defects could be formed.

The P dimension is much more critical to usable mask life and must be large enough to span mask standoffs to prevent distortion of the mask which would, in turn, cause distortion of the layer of screened material and ensure support for the mask by the green sheet when the shock absorber is first brought into contact with the mask. At the same time, the P dimension must be small enough to avoid adhesion of the screened material to the shock absorber pad, itself. In practice, it has been found that a P dimension approximately 10% greater than the mask stand-off distance (e.g. the maximum mask feature size) provides optimum usable mask life. Since the spacing of mask standoffs is related to the maximum size of mask features (e.g. the maximum uninterrupted expanse of a feature), this shock absorber pad provided good support for the mask features, avoided partial vacuums and paste pull, and avoided distortion of the mask against the green sheet. In combination with a predetermined relationship of paste viscosity and shock absorber feature separation, G, pulling effects due to paste build-up on the shock absorber pad were also avoided since paste build-up on the mask did not occur to any significant degree. The shock absorber pad was successfully used in a mass production environment to substantiate the efficacy of the pad when these dimensions were matched to paste viscosity and mask feature size.

However, it was also found that the P and G dimensions of the shock absorber pads were particularly critical and the advantages of the pad were lost when either mask standoff spacing or paste viscosity were changed. It was found that when dimension P did not bridge mask standoffs, mask damage occurred. Also, as paste build-up increased with changes in paste viscosity and adhesion characteristics, pattern voids would occur. This latter effect was found to be more severe when the combined area of contact surface was increased by increasing the P dimension. Therefore, although mask damage could be avoided by making the pad protuberant features large enough to span pattern features, mask damage control in this manner is done only at the expense of degradation of pattern quality and decreased yields. Seeking to increase the P dimension without increasing contact area by correspondingly increasing the G dimension (e.g. decreasing mask feature density) did not significantly reduce mask damage.

Therefore, the embodiment of the invention according to FIGS. 1 and 2, while capable of producing greatly improved results in terms of both pattern quality and mask life, must be at least reasonably well matched to the feature size of the mask. It also appears that this embodiment may only be capable of producing improved performance over a somewhat limited range of small mask feature sizes and paste viscosities. Because of this limitation, the shock absorber feature pattern of FIGS. 1 and 2 is considered to be inappropriate for patterns having a large feature size, such as may be encountered in power and ground planes of MLC structures, unless a greater stand-off density than customary is provided. Nevertheless, this configuration of the invention is considered preferable for masks having a small feature size or stand-off spacing.

Figure 3:
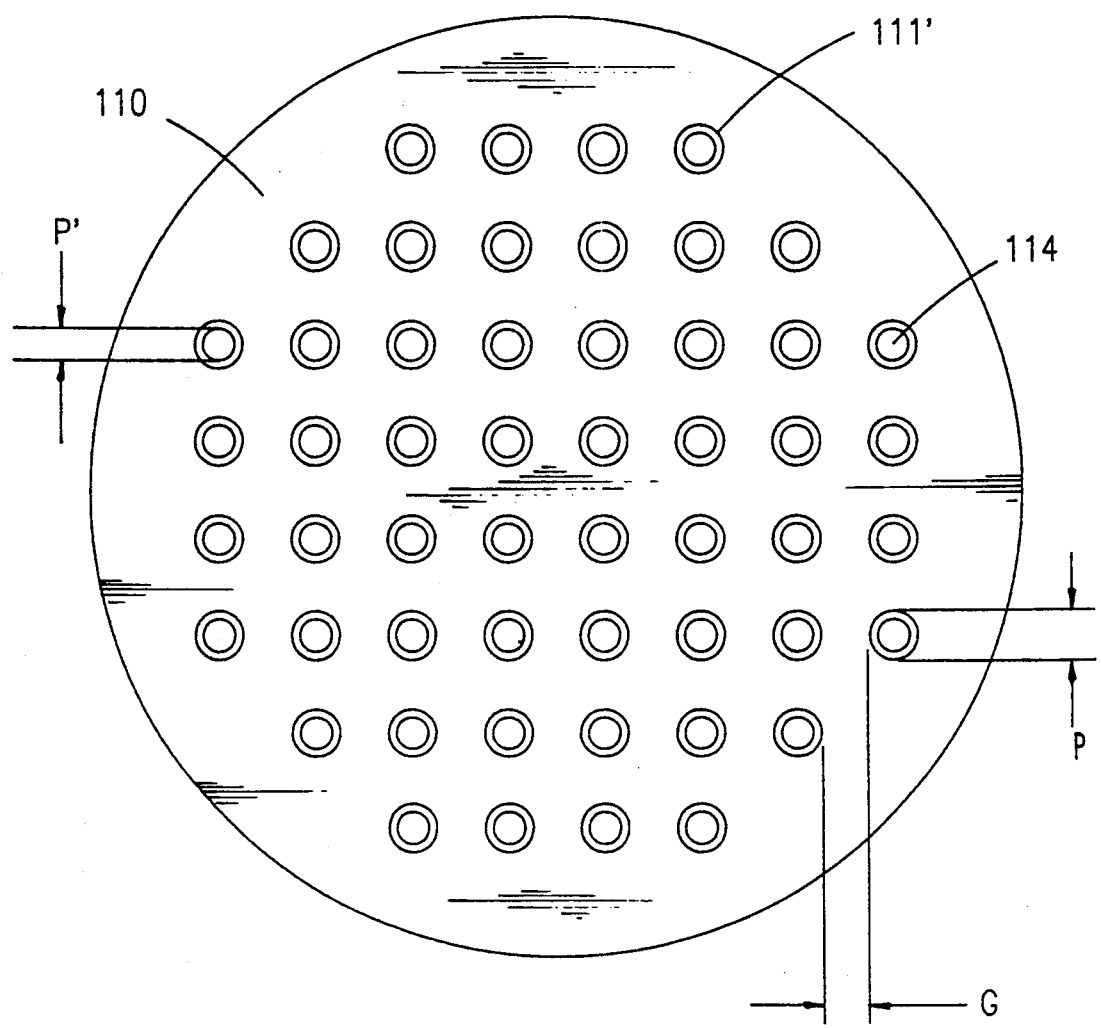
FIG. 3 is a view of the surface of another embodiment of the shock absorber pad according to the invention.
Figure 4:
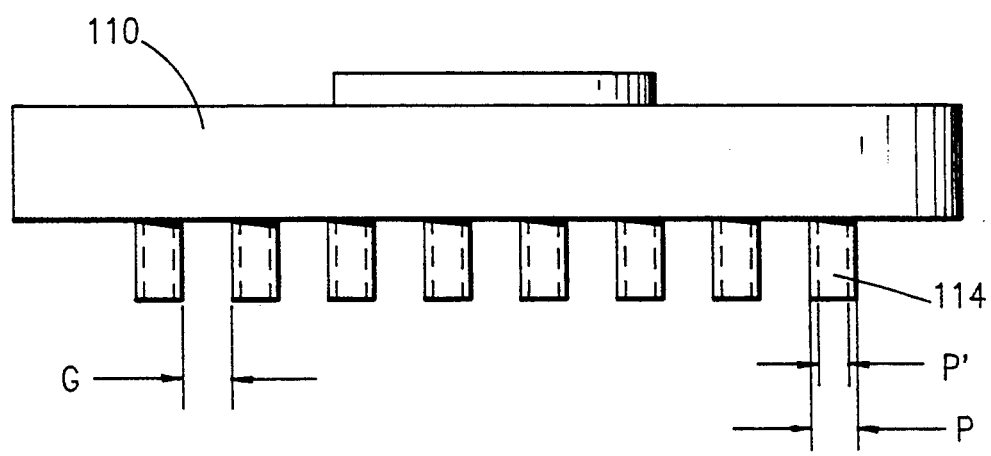
FIG. 4 is a side view of the shock absorber pad of FIG. 3.

In another embodiment of the invention, illustrated in FIGS. 3 and 4, the use of hollow pad protrusions 111' allows the shock absorber pad features to span a wide range of mask feature sizes and mask stand off spacings. Such hollow protuberant features preferably include a concavity 114 oriented toward the mask such that the contact with the mask will be in the form or shape of a substantially closed curve or geometric shape. Contact area is not necessarily increased since the hollow pad features do not require an increase in contact area with an increase in transverse feature dimension of the pad feature or protrusion and, in practice, once the P dimension has been determined, P' is determined in order to maintain or decrease the contact area relative to a design where P is less than or equal to G (in practice, about 0.020 inches).

Appropriate feature separation remains substantially dependent only on paste viscosity. However, feature separation must also be applied to the minimum dimension of the concavity of the hollow protrusions and, therefore, the internal dimension of the hollow protrusions, P' should not be significantly less than G or the characteristic distance of the stand-off spacing.

Figure 5:
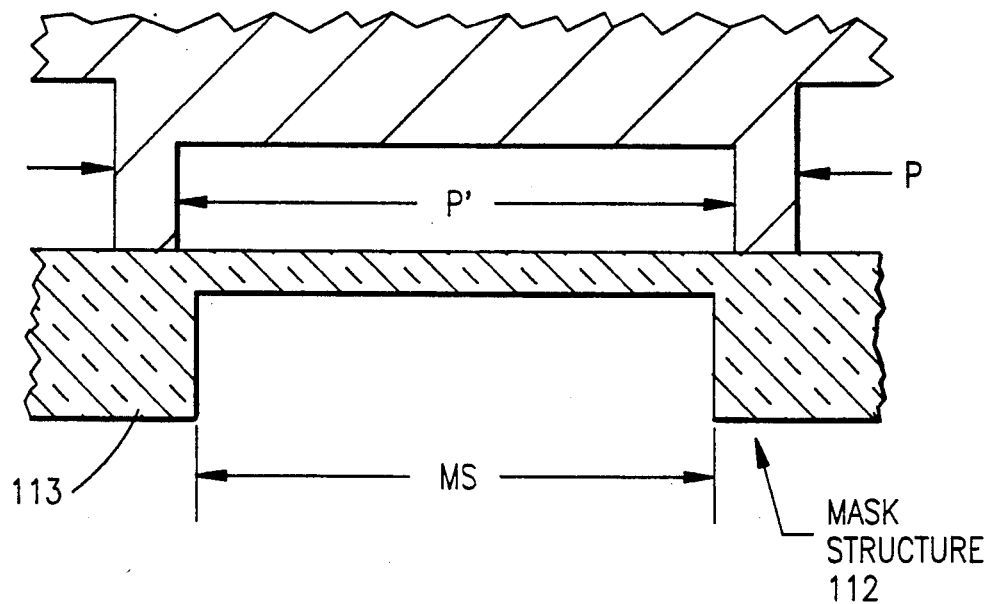
FIG. 5 is a cross-sectional view of the shock absorber according to the present invention generally corresponding to an enlargement of a portion of FIG. 2.

A cross-sectional view of this embodiment of the invention is shown in FIG. 5. Since the hollow features have the shape of a closed curve, such as a circle, if dimension P is about 10% larger than the standoff dimension, the shock absorber pad feature will bridge the standoffs over a distance which is approximately one-half of the stand-off distance. Therefore, it is evident that registration of the shock absorber pad features with the mask features is relatively unimportant if the above noted criterion for dimension P is observed.

While venting of the hollow central portions can be provided to avoid the development of partial vacuums in the hollow central portions of pad features, this has not been found to be necessary since the force of the shock absorber pad against the mask is not increased during mask separation, in accordance with the system of the above incorporated patent. In this regard, if venting is not provided, the resiliency of the pad should be kept fairly stiff to avoid forcing an excessive amount of ambient gases into the mask pattern.

It should also be noted that since the minimum feature separation of either embodiment of the invention is a critical factor, the rectangular positioning of protrusions is a good choice for most conditions. However, if a specific pad feature separation is desired, it would result in a triangular relative positioning pattern. Conversely, other patterns of pad feature positioning such as a pentagonal or hexagonal relationship may be used to reduce pad contact area. Combinations of relative positioning may be employed to maintain a more or less regular minimum pad feature separation when the shock absorber pad is arranged to have a non-flat surface such as a semispherical, parabolic or hyperbolic shape.

In practice, for the design of the shock absorber pad in accordance with the present invention, a nominal value of paste viscosity is chosen which is then used to compute the minimum shock absorber pad feature separation, G. The stand-off dimension of the mask is then used to compute the necessary shock absorber pad feature size, P. Then, if P is larger than G by more than a about 25%–50%, a hollow feature is used having an interior dimension P' which is not substantially less than dimension G. In practice, and for usual values of viscosity of conductive paste commonly used in MLC structures, a solid shock absorber pad feature is used when the standoff spacing dictates that P should be less than or equal to 0.020 inches and G is determined from FIG. 6. If P is greater than 0.020 inches and G is greater than or equal to (P - 0.030) inches, then a hollow pad feature is used and P' is made equal to G. If G is less than or equal to (P - 0.030) inches, a hollow feature is also used but P' is made equal to (P - 0.030) inches, which may be equal to or greater than G.

Once the feature dimensions and separation are determined in this manner, and the pattern of pad protrusions determined by the shape of the pad (e.g. semi-spherical, the shock absorber pad itself can be fabricated from any relatively rigid material that does not absorb the screened medium (e.g. the conductive paste), such as Teflon, by virtually any technique such as molding, etching, machining or the like.

In view of the above, it is seen that the invention provides a substantial improvement in performance and economy over the designs disclosed in the incorporated patent. The invention provides high pattern quality and extended usable mask lifetime while reducing mask damage. Pulling effects on the screened material and adherence of the screened material to the mask and shock absorber pad is virtually eliminated.

While the invention has been described in terms of a single preferred embodiment and two particular variations thereof, those skilled in the art will recognize that the invention can be practiced with modification within the spirit and scope of the appended claims. For instance, for a large value of P and a small value of G, it may be preferable to form the hollow protuberant features as groups of two or more concentric geometrical features with the separation between the concentric features being equal to or greater than the separation between such groups of features.

Having thus described my invention, what I claim as new and desire to secure by Letters Patent is as follows:

1. An apparatus for absorbing shock caused by separation of a perforated sheet from a surface after screening a viscous material through said perforated sheet, said perforated sheet being supported by said surface at locations separated by a characteristic distance approximating a maximum uninterrupted feature size to be produced by said perforated sheet, including
   a pad having a plurality of protuberant features thereon wherein a transverse dimension of at least one said protuberant feature is greater than said characteristic distance and wherein a minimum separation between each of said protuberant features is equal to or exceeds a distance determined from a nominal viscosity of said viscous material.

2. An apparatus as recited in claim 1, wherein said minimum separation between said protuberant features bears an approximately proportional relationship to said nominal viscosity of said viscous material.

3. An apparatus as recited in claim 2, wherein said proportional relationship of said minimum separation, expressed in inches, to said viscosity, expressed in Pascals per second is equivalent to 1:0.00045, ±10%.

4. An apparatus as recited in claim 1, wherein said minimum transverse dimension of said at least one protuberant feature is at least 10% larger than said characteristic distance.

5. An apparatus as recited in claim 2, wherein said minimum transverse dimension of said at least one protuberant feature is at least 10% larger than said characteristic distance.

6. An apparatus as recited in claim 3, wherein said minimum transverse dimension of said at least one protuberant feature is at least 10% larger than said characteristic distance.

7. An apparatus as recited in claim 1, wherein said protuberant features are hollow, having a concavity oriented toward said perforated sheet for contact therewith, a maximum transverse dimension across said concavity being approximately equal to or greater than said minimum separation distance.

8. An apparatus as recited in claim 2, wherein said protuberant features are hollow, having a concavity oriented toward said perforated sheet for contact therewith, a maximum transverse dimension across said concavity being approximately equal to or greater than said minimum separation distance.

9. An apparatus as recited in claim 4, wherein said protuberant features are hollow, having a concavity oriented toward said perforated sheet for contact therewith, a maximum transverse dimension across said concavity being approximately equal to or greater than said minimum separation distance.

10. An apparatus as recited in claim 5, wherein said protuberant features are hollow, having a concavity oriented toward said perforated sheet for contact therewith, a maximum transverse dimension across said concavity being approximately equal to or greater than said minimum separation distance.

11. A method of making a pad having a pattern of protuberant features for absorbing shock due to separation of a perforated sheet from a surface after screening a viscous material through said perforated sheet, including the steps of
   determining a minimum separation distance of said protuberant features based on said minimum separation to a nominal value of viscosity of said viscous material, and
   forming said protuberant features of said shock absorber pad spaced from each other by at least said minimum separation distance.

12. The method of claim 11, wherein said perforated sheet is supported by said surface at locations separated by a characteristic distance, including the further step of
   determining a minimum transverse dimension of at least one of said protuberant features as greater than said characteristic distance.

13. The method of claim 12, including the further step of
   determining a maximum transverse dimension of a concavity within at least one of said protuberant features as substantially equal to said characteristic distance or equal to or greater than said minimum separation distance.

14. A method of screening a pattern of viscous material onto a surface through a perforated sheet and separating said perforated sheet from said surface using a shock absorbing pad having protuberant features formed thereon at a predetermined spacing, including steps of
   adjusting viscosity of said viscous material in accordance with said predetermined spacing,
   screening said viscous material through said perforated sheet onto said surface, and
   separating said perforated sheet from said surface while contacting said perforated sheet with said shock absorbing pad.

15. A method as recited in claim 14, wherein said step of adjusting said viscosity of said viscous material includes adjusting said viscosity such that said viscosity, expressed in Pascals/second, approximates 2000 times said minimum spacing, ±20%, expressed in inches.

* * * * *